(12) United States Patent
Lee

(10) Patent No.: US 8,759,671 B2
(45) Date of Patent: Jun. 24, 2014

(54) THIN FILM METAL OXIDE BEARING SEMICONDUCTOR MATERIAL FOR SINGLE JUNCTION SOLAR CELL DEVICES

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 609 days.

(21) Appl. No.: 12/237,369

(22) Filed: Sep. 24, 2008

(65) Prior Publication Data

US 2009/0250105 A1     Oct. 8, 2009

Related U.S. Application Data

(60) Provisional application No. 60/976,391, filed on Sep. 28, 2007.

(51) Int. Cl.
*H01L 31/00* (2006.01)

(52) U.S. Cl.
USPC ............ 136/265; 136/255; 136/256; 136/264

(58) Field of Classification Search
USPC ............... 136/255, 265, 256, 264; 438/81
See application file for complete search history.

(56) References Cited

U.S. PATENT DOCUMENTS

| | | | |
|---|---|---|---|
| 3,520,732 A | 7/1970 | Nakayama et al. | |
| 3,828,722 A | 8/1974 | Reuter et al. | |
| 3,975,211 A | 8/1976 | Shirland | |
| 4,062,038 A | 12/1977 | Cuomo et al. | |
| 4,263,336 A | 4/1981 | Thompson et al. | |
| 4,332,974 A | 6/1982 | Fraas | |
| 4,335,266 A | 6/1982 | Mickelsen et al. | |
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |
| 4,471,155 A | 9/1984 | Mohr et al. | |
| 4,499,658 A | 2/1985 | Lewis | |
| 4,507,181 A | 3/1985 | Nath et al. | |

(Continued)

FOREIGN PATENT DOCUMENTS

| | | |
|---|---|---|
| AU | 7865198 | 2/1999 |
| DE | 3314197 A1 | 11/1983 |

(Continued)

OTHER PUBLICATIONS

Baumann et al., "Photovoltaic Technology Review" presentation, Dec. 6, 2004.*

(Continued)

*Primary Examiner* — Thanh-Truc Trinh
(74) *Attorney, Agent, or Firm* — Kilpatrick Townsend & Stockton LLP

(57) ABSTRACT

A structure for a single junction solar cell. The structure includes a substrate member having a surface region. The structure includes a first electrode structure overlying the surface region of the substrate member. A P absorber layer is formed overlying the first electrode structure. In a specific embodiment, the P absorber layer has a $P^-$ type impurity characteristics and a first optical absorption coefficient greater than $10^4$ cm$^{-1}$ in a wavelength range comprising 400 nm to 800 nm. An $N^+$ layer is provided overlying the P absorber layer and an interface region formed within a vicinity of the P layer and the $N^+$ layer. The structure also includes a high resistivity buffer layer overlying the $N^+$ layer and a second electrode structure overlying the buffer layer.

21 Claims, 5 Drawing Sheets

(56) References Cited

U.S. PATENT DOCUMENTS

| | | |
|---|---|---|
| 4,517,403 A | 5/1985 | Morel et al. |
| 4,518,855 A | 5/1985 | Malak |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A * | 3/1995 | Toma et al. .................. 136/259 |
| 5,399,504 A | 3/1995 | Ohsawa |
| 5,436,204 A | 7/1995 | Albin et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracky et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,858,819 A | 1/1999 | Miyasaka |
| 5,868,869 A | 2/1999 | Albright et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,160,215 A | 12/2000 | Curtin |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,310,281 B1 | 10/2001 | Wendt et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 * | 12/2003 | Kendall ........................ 257/30 |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 2002/0002992 A1 * | 1/2002 | Kariya et al. ................. 136/255 |
| 2002/0004302 A1 | 1/2002 | Fukumoto |
| 2002/0061361 A1 | 5/2002 | Nakahara |
| 2002/0063065 A1 | 5/2002 | Sonoda et al. |
| 2003/0075717 A1 | 4/2003 | Kondo et al. |
| 2003/0089899 A1 * | 5/2003 | Lieber et al. ..................... 257/9 |
| 2003/0188777 A1 | 10/2003 | Gaudiana et al. |
| 2003/0230338 A1 | 12/2003 | Menezes |
| 2004/0063320 A1 * | 4/2004 | Hollars ......................... 438/689 |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 * | 9/2004 | Pichler .......................... 136/263 |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 * | 4/2005 | Tuttle et al. ...................... 438/57 |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 * | 9/2005 | Basol ............................ 136/252 |
| 2005/0287717 A1 | 12/2005 | Heald et al. |

(56) References Cited

U.S. PATENT DOCUMENTS

| | | |
|---|---|---|
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1* | 6/2006 | Hantschel et al. ............ 136/252 |
| 2006/0160261 A1* | 7/2006 | Sheats et al. .................... 438/34 |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1* | 9/2007 | Yonezawa et al. ............ 136/265 |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1* | 2/2008 | Milshtein et al. ............ 136/256 |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1* | 9/2009 | Matsushima et al. ......... 136/252 |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |

FOREIGN PATENT DOCUMENTS

| | | |
|---|---|---|
| DE | 10104726 A1 | 8/2002 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | WO 2005011002 | 2/2005 |
| WO | WO 2006/126598 A1 | 11/2006 |
| WO | WO 2007/022221 A2 | 2/2007 |

OTHER PUBLICATIONS

International Search Report and Written Opinion of PCT Application No. PCT/US08/77965, date of mailing Dec. 9, 2008, 8 pages total.

Examination Report for PCT patent application PCT/US2008/077965 (Apr. 8, 2010).

International Solar Electric Technology, Inc. (ISET) "Thin Film CIGS", http://www.isetinc.com/cigs.html, Oct. 1, 2008.

Kapur et al., "Fabrication of Light Weight Flexible CIGS Solar Cells for Space Power Applications", Mat. Res. Soc. Proc. vol. 668, (2001) pp. H3.5.1-H3.5.6, Materials Research Society, Warrendale, PA 15086.

Kapur et al., Non-Vacuum Printing Process for CIGS Solar Cells on Rigid and Flexible Substrates 29th IEEE Photovoltaic Specialists Conf., New Orleans, LA, IEEE, (2002) p. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43 (2003).

Kapur et al., "Non-Vacuum Processing of $CuIn_{1-x}Ga_xSe_2$ Solar Cells on Rigid and Flexible Substrates using Nanoparticle Inks", Thin Solid Films, vol. 431-432 (2003) pp. 53-57 Proceedings of Symposium B, European Materials Research Society, Strasbourg, France.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Nanoparticle Oxides Precursor Inks for Thin Film Copper Indium Gallium Selenide (CIGS) Solar Cells", Mat. Res. Soc. Proc. vol. 668, (2001) pp. H2.6.1-H2.6.7, Materials Research Society, Warrendale, PA 15086.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $ZnxCd1_-xS$ Nanocomposites in Polymer Matrices and their Photophysical Properties, Langmuir 1998, 14, pp. 4342-4344.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

(56) References Cited

OTHER PUBLICATIONS

Yang et al., Preparation, Characterization and Electroluminescence of ZnS Nanocrystals in a Polymer Matrix, J. Mater. Chem., 1997, 7(1), pp. 131-133.
Yang et al., Electroluminescence from ZnS/CdS Nanocrystals/Polymer Composite, Synthetic Metals 91, (1997) 347-349.
Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.
International Search Report & Written Opinion of PCT Application No. PCT/US 09/46161, date of mailing Jul. 27, 2009, 14 pages total.
International Search Report & Written Opinion of PCT Application No. PCT/US 09/46802, mailed on Jul. 31, 2009, 11 pages total.
Onuma et al., Preparation and Characterization of CuInS Thin Films Solar Cells with Large Grain, Elsevier Science B.V; Solar Energy Materials & Solar Cells 69 (2001) pp. 261-269.
Final Office Action of May 31, 2011 for U.S. Appl. No. 12/621,489, 13 pages.
Notice of Allowance of May 25, 2011 for U.S. Appl. No. 12/566,651, 8 pages.
Non-Final Office Action of May 2, 2011 for U.S. Appl. No. 12/953,729, 9 pages.
Non-Final Office Action of May 2, 2011 for U.S. Appl. No. 12/953,725, 9 pages.
Non-Final Office Action of May 2, 2011 for U.S. Appl. No. 12/953,721, 9 pages.
Non-Final Office Action of May 2, 2011 for U.S. Appl. No. 12/953,716, 9 pages.
Non-Final Office Action of May 2, 2011 for U.S. Appl. No. 12/953,708, 9 pages.
Non-Final Office Action of May 2, 2011 for U.S. Appl. No. 12/953,701, 9 pages.
Notice of Allowance of Apr. 27, 2011 for U.S. Appl. No. 12/564,886, 11 pages.
Notice of Allowance of Apr. 26, 2011 for U.S. Appl. No. 12/564,046, 11 pages.
Notice of Allowance of Apr. 25, 2011 for U.S. Appl. No. 12/563,065, 11 pages.
Notice of Allowance of Apr. 19, 2011 for U.S. Appl. No. 12/567,715, 11 pages.
Notice of Allowance of Apr. 8, 2011 for U.S. Appl. No. 12/953,697, 11 pages.
Notice of Allowance of Apr. 5, 2011 for U.S. Appl. No. 12/953,679, 11 pages.
Notice of Allowance of Apr. 5, 2011 for U.S. Appl. No. 12/953,674, 11 pages.
Chopra et al., "Thin-Film Solar Cells: An Overview", 2004, Progress in Photovoltaics: Research and Applications, 2004, vol. 12, pp. 69-92.
Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.
Metha et al., "A graded diameter and oriented nanorod-thin film structure for solar cell application: a device proposal", Solar Energy Materials & Solar Cells, 2005, vol. 85, pp. 107-113.
Srikant V., et al., "On the Optical Band Gap of Zinc Oxide", Journal of Applied Physics, vol. 83, No. 10, May 15, 1998, pp. 5447-5451.
International Search Report and Written Opinion for PCT Application No. PCT/US2009/065351, mailed on Jan. 26, 2010, 13 pages.
International Search Report and Written Opinion for PCT Application No. PCT/US09/59097, mailed on Dec. 23, 2009, 12 pages.
International Search Report and Written Opinion for PCT Application No. PCT/US09/59095, mailed on Dec. 4, 2009, 12 pages.
International Search Report and Written Opinion for PCT Application No. PCT/US08/78019 mailed on Dec. 8, 2008, 9 pages.
Non-Final Office Action of Sep. 15, 2011 for U.S. Appl. No. 12/237,377, 18 pages.
Notice of Allowance of Sep. 2, 2011 for U.S. Appl. No. 12/953,721, 20 pages.
Notice of Allowance of Aug. 26, 2011 for U.S. Appl. No. 12/953,725, 20 pages.
Notice of Allowance of Aug. 25, 2011 for U.S. Appl. No. 12/953,729, 19 pages.
Non-Final Office Action of Aug. 4, 2011 for U.S. Appl. No. 12/479,409, 39 pages.
Notice of Allowance of Aug. 2, 2011 for U.S. Appl. No. 12/953,716, 18 pages.
Notice of Allowance of Aug. 1, 2011 for U.S. Appl. No. 12/577,132, 34 pages.
Notice of Allowance of Aug. 1, 2011 for U.S. Appl. No. 12/953,701, 18 pages.
Notice of Allowance of Aug. 1, 2011 for U.S. Appl. No. 12/953,708, 17 pages.
Final Office Action of Dec. 27, 2010 for U.S. Appl. No. 12/479,409, 26 pages.
Non-Final Office Action of Dec. 17, 2010 for U.S. Appl. No. 12/577,132, 11 pages.
Notice of Allowance of Dec. 14, 2010 for U.S. Appl. No. 12/558,117, 8 pages.
Supplemental Notice of Allowability of Dec. 10, 2010 for U.S. Appl. No. 12/568,641, 3 pages.
Notice of Allowance of Nov. 19, 2010 for U.S. Appl. No. 12/568,641, 6 pages.
Notice of Allowance of Oct. 21, 2010 for U.S. Appl. No. 12/565,735, 4 pages.
Restriction Requirement of Oct. 18, 2010 for U.S. Appl. No. 12/568,641, 4 pages.
Non-Final Office Action of Sep. 28, 2010 for U.S. Appl. No. 12/237,371, 15 pages.
Non-Final Office Action of Sep. 22, 2010 for U.S. Appl. No. 12/621,489, 23 pages.
Notice of Allowance of Aug. 27, 2010 for U.S. Appl. No. 12/509,136, 8 pages.
Non-Final Office Action of Aug. 5, 2010 for U.S. Appl. No. 12/565,735, 14 pages.
Non-Final Office Action of Jul. 22, 2010 for U.S. Appl. No. 12/479,409, 21 pages.
Non-Final Office Action of May 27, 2010 for U.S. Appl. No. 12/568,641, 10 pages.
Salvador, "Hole diffusion length in n-TiO2 single crystals and sintered electrodes: photoelectrochemical determination and comparative analysis," Journal of Applied Physics, vol. 55, No. 8, pp. 2977-2985, Apr. 15, 1984.

* cited by examiner

THIN FILM METAL OXIDE BEARING SEMICONDUCTOR MATERIAL FOR SINGLE JUNCTION SOLAR CELL DEVICES

CROSS-REFERENCES TO RELATED APPLICATIONS

This application claims priority to provisional patent application Ser. No. 60/976,391; filed on Sep. 28, 2007; commonly assigned, and of which is hereby incorporated by reference for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to photovoltaic materials. More particularly, the present invention provides a method and structure for manufacture of photovoltaic materials using a thin film process including Group IV materials (e.g., silicon, germanium) and metal oxides, such as copper oxide and the like. Merely by way of example, the present method and structure have been implemented using a single junction configuration, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to the present invention, techniques including a structure and method for a single junction solar cell are provided. More particularly, embodiments according to the present invention provide a structure for a single junction solar cell using thin film metal oxide semiconductor material. But it should be recognized that the present invention has a broader range of applicability.

In a specific embodiment, a structure for a single junction solar cell is provided. The structure includes a substrate member having a surface region. The structure includes a first conductor layer overlying the surface region of the substrate member. The structure includes a P absorber layer overlying the conductor layer. In a specific embodiment, the P absorber layer has a P$^-$ type impurity characteristics and a first optical absorption coefficient greater than $10^4$ cm$^{-1}$ in a wavelength range comprising 400 nm to 800 nm. The P absorber layer comprises a metal oxide semiconductor material in a specific embodiment. The structure also includes a N$^+$ layer overlying the first absorber layer. The N$^+$ layer is characterized by an N type impurity characteristics. The structure also include an interface region formed from the first absorber layer and the N$^+$ layer. A buffer layer having a suitable resistance is provided overlying the N$^+$ layer. The structure also includes a second conductor layer overlying the buffer layer.

In an alternative embodiment, a method for forming a single junction solar cell is provided. The method includes providing a substrate member having a surface region. A first conductor layer is formed overlying the surface region of the substrate member and a P absorber layer is formed overlying the conductor layer. In a specific embodiment, the P absorber layer has a P$^-$ type impurity characteristics and a first optical absorption coefficient greater than $10^4$ cm$^{-1}$ in a wavelength range comprising 400 nm to 800 nm. The method forms a N$^+$ layer overlying the P absorber layer and an interface region is formed from the P absorber layer and the N$^+$ layer in a specific embodiment. The method includes forming a high resistivity buffer layer overlying the N$^+$ layer and forming a second conductor layer overlying the buffer layer.

Depending on the embodiment, one or more of these features may be included. Embodiments according to the present invention provide a single junction solar cell structure using metal oxide semiconductor materials. The present structure can be provided using easy to use processes using convention equipment without further modifications. The metal oxide semiconductor materials may be nanostructured or in bulk depending on the embodiment. In a specific embodiment, the present solar cell structure provides a higher conversion efficiency in converting sunlight into electric energy. Depending on the embodiment, the conversion efficiency may be 15 percent to 20 percent or greater for the resulting single junction solar cell. Additionally, the present single junction solar cell structure can be provided using large scale manufacturing processes, which reduce cost in manufacturing of the photovoltaic devices. Depending on the embodiments, one or more of these benefits may be achieved. These benefits will be described more fully throughout the present specification, and particularly below.

DETAILED DESCRIPTION OF THE INVENTION

According to embodiments of the present invention, techniques directed to photovoltaic cell structure are provided. More particularly, embodiments according to the present invention provide a single junction photovoltaic cell structure and resulting photovoltaic cell having a high conversion efficiency. But it would be recognize that embodiments according to the present invention have a much broader range of applicability.

Figure 1:
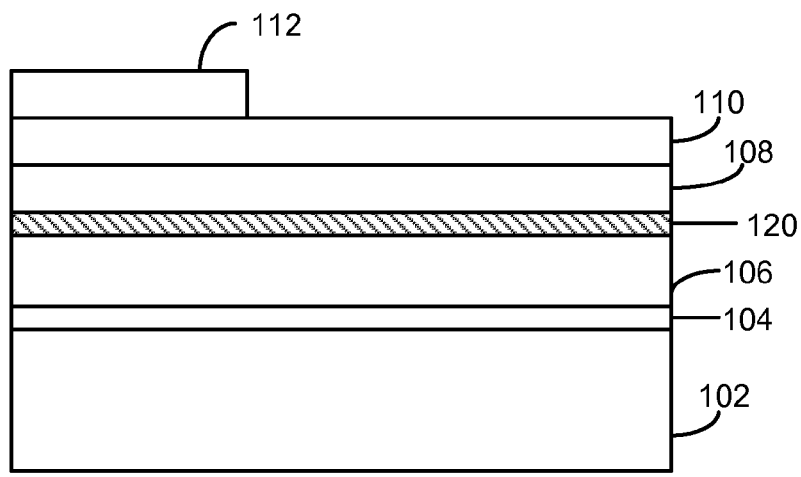
FIG. 1 is a simplified diagram illustrating a single junction solar cell structure according to an embodiment of the present invention.

FIG. 1 is a simplified diagram illustrating a single junction solar cell structure 100 according to an embodiment of the present invention. As shown, the single junction solar cell structure includes a substrate member 102 having a surface region. The substrate member can be made of an insulator material, a conductor material, or a semiconductor material, depending on the application. In a specific embodiment, the conductor material can be nickel, molybdenum, aluminum, or a metal alloy such as stainless steel and the likes. In a embodiment, the semiconductor material may include silicon, germanium, silicon germanium, compound semiconductor material such as III-V materials, II-VI materials, and others. In a specific embodiment, the insulator material can be a transparent material such as glass, quartz, fused silica. Alternatively, the insulator material can be a polymer material, a ceramic material, or a layer or a composite material depending on the application. The polymer material may include acrylic material, polycarbonate material, and others, depending on the embodiment. Of course, there can be other variations, modifications, and alternatives.

As shown in FIG. 1, the single junction solar cell structure includes a first conductor layer 104 overlying the surface region of the substrate member to form a first electrode structure. In a specific embodiment, the first electrode structure can be made of a suitable material or a combination of materials. The first electrode structure can be made from a transparent conductive electrode or materials that are light reflecting or light blocking depending on the embodiment. Examples of the optically transparent material can include indium tin oxide (ITO), aluminum doped zinc oxide, fluorine doped tin oxide and can be others. In a specific embodiment, the first electrode may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Alternatively, the first electrode structure may be made of a carbon based material such as carbon or graphite. Yet alternatively, the first electrode structure may be made of a conductive polymer material, depending on the application. Of course there can be other variations, modifications, and alternatives.

Referring again to FIG. 1, the single junction solar cell structure includes an absorber layer 106 overlying the first electrode layer 104. In a specific embodiment, the absorber layer 106 is characterized by a $P^-$ characteristics. That is, the absorber layer 106 absorbs electromagnetic radiation forming positively charged carriers within a thickness of the absorber layer 106. In a specific embodiment, the absorber layer 106 can comprise a first metal oxide semiconductor material. The first metal oxide semiconductor material may be provided in various spatial morphologies of different shapes and sizes. For example, the first metal oxide semiconductor material may be nanostructured, such as nanotubes, nanocolumns, nanocrystals, and the like. In other embodiments, the first metal oxide semiconductor material can be provided as bulk material. Of course there can be other variations, modifications, and alternatives.

In a specific embodiment, the first metal oxide semiconductor material has an optical absorption coefficient greater than about $10^4$ cm$^{-1}$ for electromagnetic radiation in a wavelength range of about 400 nm to about 800 nm. In an alternative embodiment, the first metal oxide semiconductor material can have an optical absorption coefficient greater than about $10^4$ cm$^{-1}$ for electromagnetic radiation in a wavelength range of about 450 nm to about 700 nm. Of course there can be other variations, modifications, and alternatives.

The first metal oxide semiconductor material is characterized by a carrier mobility. The carrier mobility of the first metal oxide semiconductor material can range from about $10^{-6}$ cm$^2$/V–s to about $10^6$ cm$^2$/V–s in a specific embodiment. In another embodiment, the carrier mobility of the first metal oxide semiconductor material can range from about $10^{-3}$ cm$^2$/V–s to about $10^3$ cm$^2$/V–s. In certain embodiments, the carrier mobility of the first metal oxide semiconductor material can range from about $10^{-3}$ cm$^2$/V–s to about $10^3$ cm$^2$/V–s. Of course there can be other variations, modifications, and alternatives.

The first metal oxide semiconductor material is characterized by a bandgap. In a specific embodiment, the first absorber layer has a bandgap of about 1.0 eV to about 2.2 eV. In an alternative embodiment, the first metal oxide semiconductor material can have a bandgap of about 1.0 eV to about 2.0 eV. In a preferred embodiment, the first metal oxide semiconductor material can have a bandgap of about 1.2 eV to about 1.8 eV. Of course there can be other variations, modifications, and alternatives depending on the application.

Referring to FIG. 1, a $N^+$ layer 108 is formed overlying the absorber layer 106, which has a $P^-$ characteristics. In a specific embodiment, the $N^+$ layer 108 comprises a second metal oxide semiconductor material. Alternatively, the $N^+$ layer 108 can comprise a metal sulfide material. Examples of the second metal oxide material can include one or more oxides of copper, zinc oxide, and the like. Examples of metal sulfide material can include zinc sulfide, iron sulfides and others. The $N^+$ layer 108 may be provided in various spatial morphologies of different shapes and sizes. In a specific embodiment, the N⁺ layer 108 may comprise of suitable materials that are nanostructured, such as nanocolumn, nanotubes, nanorods, nanocrystals, and others. In an alternative embodiment, the N⁺ layer 108 may also be provided as other morphologies, such as bulk materials depending on the application. Of course there can be other variations, modifications, and alternatives.

In a specific embodiment, an interface region 120 is caused by the P absorber layer and the N⁺ layer as shown in FIG. 1. In a preferred embodiment, the interface layer 120 allows for the formation of a pn junction from the positively charged carriers and the negatively charged carriers. In a specific embodiment, the pn junction is characterized by a pn+ junction and a depletion region substantially in the absorber layer in the vicinity of the interface region. Of course there can be other variations, modifications, and alternatives.

In a specific embodiment, the single junction solar cell structure includes a buffer layer 110 overlying the second absorber layer. The buffer layer is a suitable material having desired characteristics. Of course there can be other variations, modifications, and alternatives.

Referring again to FIG. 1, a second conductor layer 112 is formed overlying the buffer layer to form a second electrode structure. In a specific embodiment, the second electrode structure can be made of a suitable material or a combination of materials. The second electrode structure can be made from a transparent conductive electrode or materials that are light reflecting or light blocking depending on the embodiment. Preferably the second electrode structure comprises an optically transparent material such as indium tin oxide (ITO), aluminum doped zinc oxide, fluorine doped tin oxide and others. In a specific embodiment, the second electrode structure may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Alternatively, the second electrode structure may be made of a carbon based material such as carbon or graphite. Yet alternatively, the second electrode structure may be made of a conductive polymer material, depending on the application. Of course there can be other variations, modifications, and alternatives.

Figure 2:
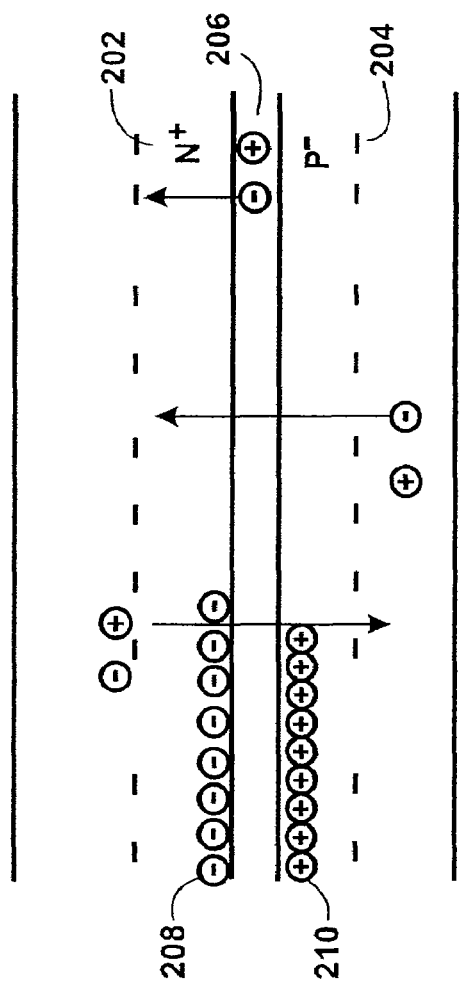
FIG. 2 is a simplified diagram illustrating a junction region for the single junction solar cell structure according to an embodiment of the present invention.

FIG. 2 is a more detailed diagram illustrating the interface region according to an embodiment of the present invention. As shown, a N⁺ layer 202 is formed overlying absorber layer 204 to form a pn junction. In a specific embodiment, the absorber layer is characterized by a P type impurity characteristic, and has optical absorption coefficient greater than about $10^4$ cm$^{-1}$ for electromagnetic radiation in the wavelength range of about 400 nm to 750 nm. Electron-hole pairs are generated in the absorber layer upon exposing to the electromagnetic radiation and a depletion region 206 is formed substantially in the absorber layer in a vicinity of an interface region. As merely an example, the absorber layer can be a first metal oxide semiconductor material having a bandgap of about 1.0 eV to about 2.0 eV. In a specific embodiment, the first metal oxide semiconductor material can include oxides of copper such as cupric oxide or cuprous oxide, oxides of iron such as ferrous oxide, ferric oxide, tungsten oxide and other suitable materials. The first metal oxide semiconductor material may be provided in various spatial configuration, for example, as nanostructure such as nanocolumn, nanotubes, nanorods, nanocrystals, and others. In an alternative embodiment, the first metal oxide semiconductor material may be provided as a bulk material depending on the application. Of course there can be other variations, modifications, and alternatives.

In a specific embodiment, the N⁺ layer may comprise a second metal oxide material, a metal sulfide material, a combination, or other suitable materials. In a specific embodiment, the N⁺ layer is characterized by a second bandgap ranging from 2.8 eV to 4.5 eV. Examples of the second metal oxide material may include zinc oxide or the like. The second metal oxide material may be provided in various spatial configuration, for example, as nanostructure, such as nanocolumn, nanotubes, nanocrystals, and others. The second metal oxide material may be provided as a bulk material depending on the application. Of course there can be other variations, modifications, and alternatives.

In a specific embodiment, the P layer is characterized by a first bandgap ranging from about 1.0 eV to about 2.0 eV. The N⁺ layer is characterized by a second bandgap ranging from about 2.8 eV to about 5.0 eV. In a specific embodiment, the second bandgap is greater than the first bandgap. As an example, the N⁺ layer may comprise of zinc oxide material having a bandgap of about 3.4 eV, the absorber layer can comprise of copper oxide having a bandgap of about 1.2 eV. Of course there can be other variations, modifications, and alternatives.

Figure 3:
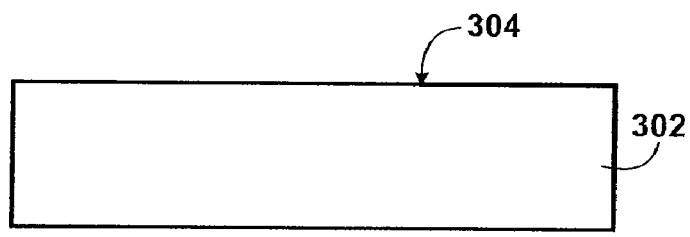
FIGS. 3-8 are simplified diagrams illustrating a method for fabricating the single junction solar cell using thin metal oxide semiconductor material in a specific embodiment

FIGS. 3-8 are simplified diagrams illustrating a method for fabricating a single junction solar cell using thin metal oxide semiconductor material in a specific embodiment. These diagrams are merely examples, which should not unduly limit the claims herein. One skilled in the art would recognize other variations, modifications, and alternatives. As shown in FIG. 3, a substrate member 302 is provided. The substrate member includes a surface region 304. The substrate member can be made of an insulator material, a conductor material, or a semiconductor material, depending on the application. In a specific embodiment, the conductor material can be nickel, molybdenum, aluminum, or a metal alloy such as stainless steel and the likes. In an embodiment, the semiconductor material may include silicon, germanium, silicon germanium, compound semiconductor material such as III-V materials, II-VI materials, and others. In a specific embodiment, the insulator material can be a transparent material such as glass, quartz, fused silica. Alternatively, the insulator material can be a polymer material, a ceramic material, or a layer or a composite material depending on the application. The polymer material may include acrylic material, polycarbonate material, and others, depending on the embodiment.

Figure 4:
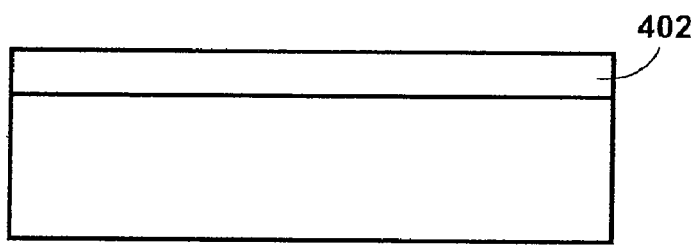

Referring to FIG. 4, the method includes forming a first electrode structure 402 overlying the surface region of the substrate member. In a specific embodiment, the first electrode structure can be made of a suitable material or a combination of materials. The first electrode structure can be made from a transparent conductive electrode or materials that are light reflecting or light blocking depending on the embodiment. Examples of the optically transparent conductive material can include indium tin oxide (ITO), aluminum doped zinc oxide, fluorine doped tin oxide and others. The transparent conductive material may be deposited using techniques such as sputtering, or chemical vapor deposition. In a specific embodiment, the first electrode may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Alternatively, the first electrode structure may be made of a carbon based material such as carbon or graphite. Yet alternatively, the first electrode structure may be made of a conductive polymer material, depending on the application. Of course there can be other variations, modifications, and alternatives.

Figure 5:
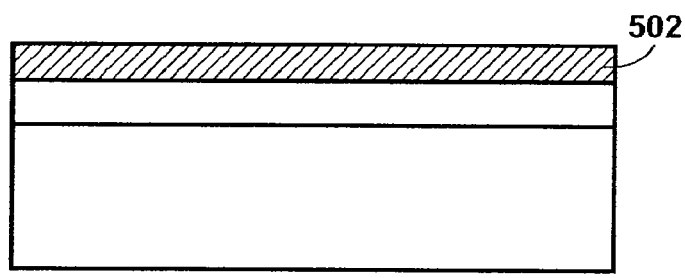

Referring to FIG. 5, the method includes forming an absorber layer 502 overlying the first electrode structure. The absorber layer has a P$^-$ type impurity characteristics in a specific embodiment. Preferably, the absorber layer is characterized by an optical absorption coefficient greater than about $10^4$ cm$^{-1}$ in the wavelength ranging from about 400 nm to about 750 nm in a specific embodiment. In a specific embodiment, the absorber layer can be made of a first metal oxide semiconductor material having a bandgap ranging from about 1.0 eV to about 2.0 eV. As merely an example, the metal oxide semiconductor material can be oxides of copper (that is cupric oxide or cuprous oxide, or a combination) deposited by an electrochemical method or by chemical vapor deposition technique. Of course there can be other variations, modifications, and alternatives.

Figure 6:
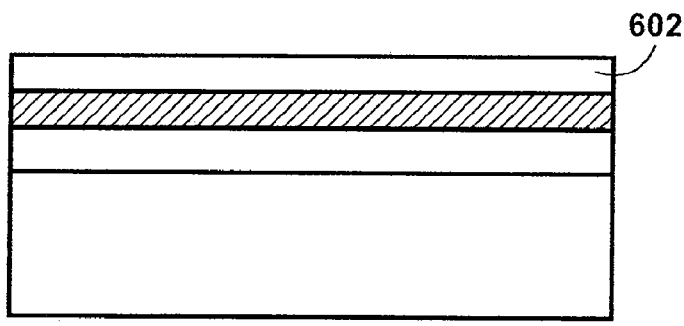

In a specific embodiment, the method includes forming a N$^+$ layer 602 overlying the absorber layer, which has a P$^-$ type impurity characteristics, as shown in FIG. 6. The N$^+$ layer can comprise a second metal oxide semiconductor material in a specific embodiment. Alternatively, the N$^+$ layer can comprise a metal sulfide material. Examples of the second metal oxide material can include one or more oxides of copper, zinc oxide, and the like. Examples of metal sulfide material can include zinc sulfide, iron sulfides and others. The N$^+$ layer may be provided in various spatial morphologies of different shapes and sizes. In a specific embodiment, the N$^+$ layer may comprise of suitable materials that are nanostructured, such as nanocolumn, nanotubes, nanorods, nanocrystals, and others. In an alternative embodiment, the N$^+$ layer may also be provided as other morphologies, such as bulk materials depending on the application. Of course there can be other variations, modifications, and alternatives. Of course there can be other modifications, variations, and alternatives.

Figure 7:
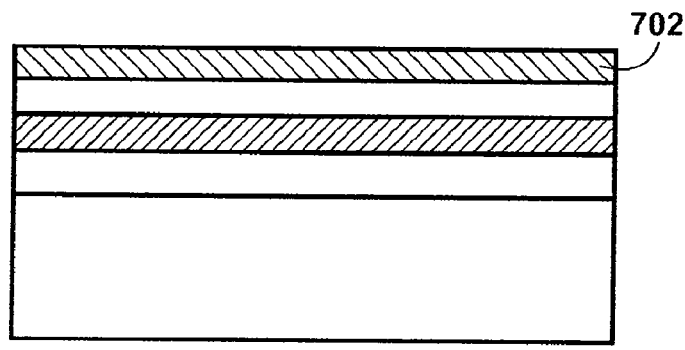

Referring to FIG. 7, the method for fabricating a single junction solar cell using thin metal oxide semiconductor material includes providing a buffer layer 702 overlying a surface region of the N$^+$ layer. In a specific embodiment, the buffer layer comprises of a high resistivity material. Of course there can be other modifications, variations, and alternatives.

Figure 8:
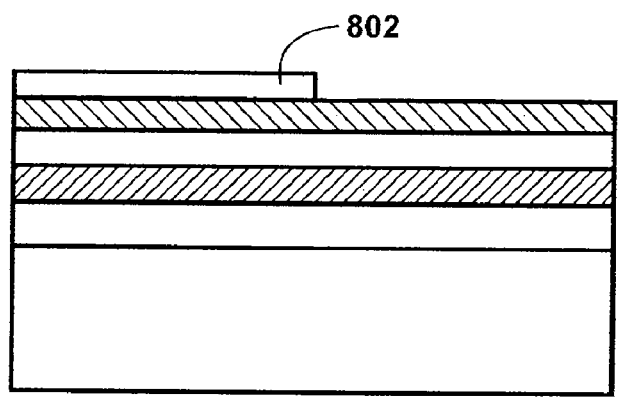

As shown in FIG. 8, the method includes forming a second conductor layer to form a second electrode structure 802 overlying the buffer layer. In a specific embodiment, the second electrode structure can be made of a suitable material or a combination of materials. The second electrode structure can be made from a transparent conductive electrode or materials that are light reflecting or light blocking depending on the embodiment. Examples of the optically transparent conductive material can include indium tin oxide (ITO), aluminum doped zinc oxide, fluorine doped tin oxide and others. The transparent conductive material may be deposited using techniques such as sputtering, or chemical vapor deposition. In a specific embodiment, the first electrode may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Alternatively, the second electrode structure may be made of a carbon based material such as carbon or graphite. Yet alternatively, the second electrode structure may be made of a conductive polymer material, depending on the application. Of course there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A structure for a single junction solar cell, the structure comprising,
    a substrate member having a surface region, wherein the substrate comprises germanium;
    a first conductor layer overlying the surface region of the substrate member, the first conductor layer comprising a carbon-based material;
    a P absorber layer overlying the conductor layer, the P absorber layer having a P– type impurity characteristics and a first optical absorption coefficient greater than $10^4$ cm$^{-1}$ in a wavelength range comprising 400 nm to 800 nm, wherein the P absorber layer comprises a first metal oxide semiconductor material;
    a N+ layer overlying the P absorber layer;
    an interface region formed between the P absorber layer and of the N+ layer;
    a resistive buffer layer overlying the N+ layer; and
    a second conductor layer overlying the buffer layer,
    wherein the buffer layer is separate from the second conductor layer.

2. The structure of claim 1 wherein the P absorber layer comprises a nanostructured material.

3. The structure of claim 1 wherein the P absorber layer comprises a bulk material.

4. The structure of claim 1 wherein the P absorber layer is chosen from copper oxides (for example, CuO, Cu2O).

5. The structure of claim 4 wherein the P absorber layer has a first bandgap ranging from about 1.0 eV to about 2.0 eV.

6. The structure of claim 1 wherein the N+ layer comprises a second metal oxide material or a metal sulfide material.

7. The structure of claim 1 wherein the N+ layer has a bandgap ranging from about 2.5 eV to about 5.0 eV.

8. The structure of claim 6 wherein the second metal oxide material is provided in a nanostructured configuration.

9. The structure of claim 6 wherein the second metal oxide material is provided as a bulk material.

10. The structure of claim 6 wherein the metal sulfide material is chosen from zinc sulfide, iron sulfide, or others.

11. The structure of claim 6 wherein the metal sulfide material is provided as a nanostructured material.

12. The structure of claim 6 wherein the metal sulfide material is provided as a bulk material.

13. The structure of claim 1 wherein the interface region formed from the P absorber layer and the N+ layer comprises a pn junction.

14. The structure of claim 13 wherein the pn junction is a pn+ junction.

15. The structure of claim 1 wherein the first conductor layer comprises a transparent conducting material, for example, indium tin oxide, (ITO), aluminum doped zinc oxide, fluorine doped tin oxide and others.

16. The structure of claim 1 wherein the second conductor layer comprises a transparent conducting material, for example, indium tin oxide (ITO), aluminum doped zinc oxide, fluorine doped tin oxide and others.

17. The structure of claim 1 wherein the second conductor layer comprises a conductive polymer material or a carbon based conductor material.

18. A method for forming a single junction solar cell, the method comprising;
    providing a substrate member having a surface region, wherein the substrate member comprises quartz;
    forming a first conductor layer overlying the surface region of the substrate member;
    forming a P absorber layer overlying the conductor layer, the P absorber layer having a P− type impurity characteristics and a first optical absorption coefficient greater than $10^4$ cm$^{-1}$ in a wavelength range comprising 400 nm to 800 nm, wherein the P absorber layer comprises a first metal oxide semiconductor material;
    forming a N+ layer overlying the P absorber layer;
    forming an interface region between the P absorber layer and the N+ layer;
    forming a resistive buffer layer overlying the N+ layer; and
    forming a second conductor layer overlying the buffer layer, wherein the second conductor layer comprises a carbon-based material;
    wherein the buffer layer is separate from the second conductor layer.

19. A single junction solar cell comprising,
    a substrate member having a surface region, wherein the substrate member comprises fused silica;
    a first conductor layer overlying the surface region of the substrate member, wherein the first conductor layer comprises a conductive polymer material;
    an absorber layer overlying the conductor layer comprising a metal oxide semiconductor material;
    a nanostructured metal oxide layer overlying the absorber layer;
    a resistive buffer layer overlying the nanostructured metal oxide layer; and
    a second conductor layer overlying the buffer layer,
    wherein the buffer layer is separate from the second conductor layer and the nanostructured metal oxide layer.

20. The single junction solar cell of claim 19 wherein the nanostructured metal oxide layer comprises nanocolumns, nanotubes, nanorods, or nanocrystals.

21. The single junction solar cell of claim 19 wherein the second conductor layer comprises a carbon-based material.

* * * * *